(12) United States Patent
Skroch

(10) Patent No.: US 7,093,144 B2
(45) Date of Patent: Aug. 15, 2006

(54) SIGNAL TRANSFER ACROSS A VOLTAGE DOMAIN BOUNDARY

(75) Inventor: Jonathan P. Skroch, West Roxbury, MA (US)

(73) Assignee: Analog Devices, Inc., Norwood, MA (US)

( * ) Notice: Subject to any disclaimer, the term of this patent is extended or adjusted under 35 U.S.C. 154(b) by 210 days.

(21) Appl. No.: 10/788,241

(22) Filed: Feb. 25, 2004

(65) Prior Publication Data

US 2005/0184757 A1    Aug. 25, 2005

(51) Int. Cl.
*G06F 1/26* (2006.01)
(52) U.S. Cl. ............ 713/300; 713/310; 327/143; 327/333; 326/63
(58) Field of Classification Search ............ 326/63, 326/68, 81; 327/333
See application file for complete search history.

(56) References Cited

U.S. PATENT DOCUMENTS

| 5,510,748 A * | 4/1996 | Erhart et al. ............ 327/530 |
| 2005/0162188 A1* | 7/2005 | Newman .................. 326/62 |

\* cited by examiner

*Primary Examiner*—Vibol Tan
(74) *Attorney, Agent, or Firm*—Wolf, Greenfield & Sacks, P.C.

(57) ABSTRACT

A circuit and method are provided enabling the transfer of signals from a first voltage domain to a second voltage domain. The circuit comprises level shifters enabling the signal transfer, and is space-efficient and power efficient. A 3-wire serial protocol is used to enable the serial transmission of signals across the voltage domain boundary, and provides two distinct reset states.

17 Claims, 6 Drawing Sheets

FIG. 6

| rst | lv_clk | COMMENTS |
|---|---|---|
| 0 | 0 | NO OPERATION |
| 0 | 1 | TRANSFER BITS |
| 1 | 0 | RESET SHIFT REGISTER, DIVIDE-BY-2 COUNTER; AND WRITE PENDING STATUS REGISTER |
| 1 | 1 | RESET SHIFT REGISTER |

FIG. 7

| STATE | START BIT | ADDRESS | | | | DATA BYTE | | | | | | | |
|---|---|---|---|---|---|---|---|---|---|---|---|---|---|
| 1  | 0 | 0  | 0  | 0  | 0  | 0  | 0  | 0  | 0  | 0  | 0  | 0  | 0  |
| 2  | 0 | 0  | 0  | 0  | 0  | 0  | 0  | 0  | 0  | 0  | 0  | 0  | 1  |
| 3  | 0 | 0  | 0  | 0  | 0  | 0  | 0  | 0  | 0  | 0  | 0  | 1  | A3 |
| 4  | 0 | 0  | 0  | 0  | 0  | 0  | 0  | 0  | 0  | 0  | 1  | A3 | A2 |
| 5  | 0 | 0  | 0  | 0  | 0  | 0  | 0  | 0  | 0  | 1  | A3 | A2 | A1 |
| 6  | 0 | 0  | 0  | 0  | 0  | 0  | 0  | 0  | 1  | A3 | A2 | A1 | A0 |
| 7  | 0 | 0  | 0  | 0  | 0  | 0  | 0  | 1  | A3 | A2 | A1 | A0 | D7 |
| 8  | 0 | 0  | 0  | 0  | 0  | 0  | 1  | A3 | A2 | A1 | A0 | D7 | D6 |
| 9  | 0 | 0  | 0  | 0  | 0  | 1  | A3 | A2 | A1 | A0 | D7 | D6 | D5 |
| 10 | 0 | 0  | 0  | 0  | 1  | A3 | A2 | A1 | A0 | D7 | D6 | D5 | D4 |
| 11 | 0 | 0  | 0  | 1  | A3 | A2 | A1 | A0 | D7 | D6 | D5 | D4 | D3 |
| 12 | 0 | 0  | 1  | A3 | A2 | A1 | A0 | D7 | D6 | D5 | D4 | D3 | D2 |
| 13 | 0 | 1  | A3 | A2 | A1 | A0 | D7 | D6 | D5 | D4 | D3 | D2 | D1 |
| 14 | 1 | A3 | A2 | A1 | A0 | D7 | D6 | D5 | D4 | D3 | D2 | D1 | D0 |
| 15 | 0 | 0  | 0  | 0  | 0  | 0  | 0  | 0  | 0  | 0  | 0  | 0  | 0  | ized that the invention is not limited to such values, but rather that the present invention applies to a variety of circuits in which signals are transferred across a voltage domain boundary.

SIGNAL TRANSFER ACROSS A VOLTAGE DOMAIN BOUNDARY

BACKGROUND OF INVENTION

1. Field of Invention

The present invention relates generally to circuits and methods that involve multiple voltage domains. More specifically, the present invention relates to circuits and methods for transferring signals across a voltage domain boundary.

2. Discussion of Related Art

Processor circuitry often includes multiple logic domains, wherein the logic domains may be distinguished by a difference in voltage and/or clocking speeds. For example, a processor may comprise a domain that utilizes "high voltage" logic, and another domain that utilizes "low voltage" logic, the terms high voltage and low voltage being used herein merely to distinguish the two. The voltage difference of the domains may take any value. If the processor operation requires communication between logic components belonging to different voltage domains, circuitry must be provided to enable the communication. The circuitry may take the form of level shifters, which function to shift the level of a signal from a low voltage to a high voltage, while maintaining the state of the signal, if the signal is intended to cross the boundary from a low voltage domain to a high voltage domain. Similarly, level shifters may operate to shift the level of a signal from a high voltage to a low voltage, while maintaining the state of the signal, if the signal is intended to cross the boundary from a high voltage domain to a low voltage domain. It is noted that the terms "domain" and "domain boundary" as used herein do not necessarily imply a physical or geometrical structure or division. Rather, the term "domain" is used to distinguish between types of components.

An example of a known processor implementing logic domains of differing voltages is the ADSP-BF535 processor, produced by Analog Devices, Inc. Communication is required between logic components in the different domains. In this processor, one level shifter is provided for each bit that is to be transferred from the low voltage domain to the high voltage domain, and from the high voltage domain to the low voltage domain. In essence, the configuration allows parallel transfer of data bits across the voltage domain boundary. In order to transfer a large number of bits in parallel by this method, many level shifters must be provided. Since level shifters can be expensive in terms of occupied chip area and power consumption, it is desirable to minimize the number of level shifters used. Thus, a need exists for space-saving and energy efficient circuits and methods that enable the transfer of signals across a voltage domain boundary.

SUMMARY OF INVENTION

One aspect of the present invention provides a processor comprising a first voltage domain and a second voltage domain. The processor further comprises a first level shifter configured to transfer a reset signal from the first voltage domain to the second voltage domain, a second level shifter configured to transfer a clock signal from the first voltage domain to the second voltage domain, and a third level shifter configured to transfer a data signal from the first voltage domain to the second voltage domain.

Another aspect of the invention provides a method of transferring signals from a first voltage domain to a second voltage domain. The method comprises using a first level shifter to transfer a reset signal from the first voltage domain to the second voltage domain, using a second level shifter to transfer a clock signal from the first voltage domain to the second voltage domain, and using a third level shifter to transfer a data signal from the first voltage domain to the second voltage domain. A 3-wire serial protocol is provided, including two distinct reset states.

According to another aspect of the invention, a method of transferring a data signal and a non-data signal from a first voltage domain to a second voltage domain is provided. For purposes of this application, the term "non-data" implies any signal not comprising data bits. The method comprises using a first level shifter to transfer the data signal from the first voltage domain to the second voltage domain, and using a second level shifter to transfer a non-data signal from the first voltage domain to the second voltage domain.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 6 illustrates the operational states of the 3-wire serial protocol according to the present invention.

FIG. 7 is an illustration of the 3-wire serial protocol according to the present invention.

DETAILED DESCRIPTION

The present invention will now be illustrated by way of a non-limiting example of a Real Time Clock (RTC) peripheral. It should be appreciated that the invention applies to other circuits and other peripherals than those described herein. For the purposes of simplification only, specific values of voltages, clock frequencies, and other circuit parameters will be discussed. It should be appreciated that the invention is not limited to such values, but rather that the present invention applies to a variety of circuits in which signals are transferred across a voltage domain boundary.

Figure 1:
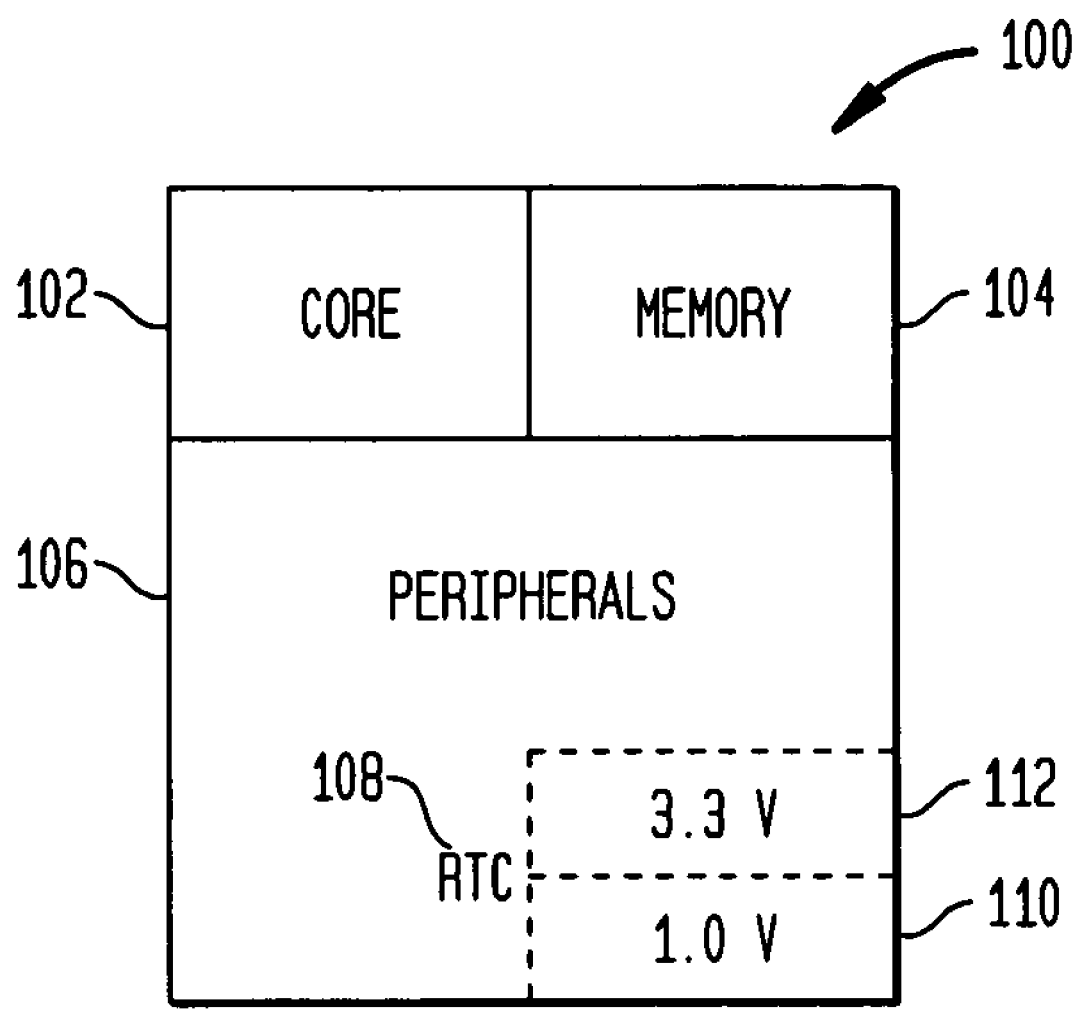
FIG. 1 is a block diagram of a processor configuration to which the present invention may apply.

FIG. 1 is a block diagram of the type of processor to which the present invention may apply. The processor 100 comprises a core 102, a memory 104, and peripherals 106. Peripherals are circuits or components that are employed by the processor in addition to the basic processor components. A specific, but non-limiting, example of a peripheral is the Real Time Clock (RTC) peripheral 108. Other peripherals may be, and often are, included in the processor 100, and the invention is not limited to a processor of the configuration of FIG. 1. Other peripherals may include serial ports, a Direct Memory Access (DMA) controller, various timers, or other commonly known peripherals. As shown, the RTC peripheral 108 implements logic in two voltage domains, a 1.0 Volt (V) domain 110 and a 3.3 V domain 112. One skilled in the art will recognize that other voltage values may be used in addition to, or in place of, those listed. Although the illustrations in FIGS. 1, 2, 3, and 5 indicate physical separation of the domains, such physical separation is not necessary to the invention. As mentioned previously, the use of the term "domain" within this text implies a differentiation between types of components, and not a physical constraint. The reason for the presence of multiple voltage domains is now described.

Modern day integrated circuit components, such as transistors, resistors, and capacitors, are continuously being fabricated with smaller dimensions, allowing a greater number of components to be placed or fabricated in a given area of an integrated circuit chip. Additionally, in some systems, smaller components are able to operate more quickly than their larger counterparts, and are thus desired. The voltage which such components can withstand without sustaining damage is often related to their physical dimensions. Thus, as the components become smaller, their tolerance of large voltages may also diminish. Some logic components, for example, may only have a rated operating voltage of approximately 1.0 V. These components can then be categorized as belonging to a 1.0 V logic domain. However, as is generally recognized by one of skill in the art, 1.0 V may not be a sufficient voltage value for powering other portions of a circuit, or for transmitting signals over long wire distances. Specifically, a processor, such as processor 100, may form part or all of an integrated circuit. The input/output (I/O) pins of the integrated circuit are likely to be connected to a larger voltage source than 1.0 V, for example 3.3 V. Thus, certain components of the processor may be designed as 3.3 V logic components, i.e., able to withstand 3.3 V signals without damage. The implementation of components with a 1.0 V signal tolerance and components with a 3.3 V signal tolerance gives rise to the different voltage domains in the processor. It is noted that this motivation is mentioned for purposes of understanding only, and the invention is not limited to any particular motivation for implementing domains of differing voltages. Additionally, the 3.3 V signal and 1.0 V signal could be provided in many ways; for instance, both could be provided by external power supplies, or by any other known methods.

The RTC peripheral 108 of FIG. 1 may perform several functions. For instance, one function of the RTC may be to keep track of time in seconds, minutes, hours, and days. Other functions may include a stopwatch function, an alarm function, or any other timekeeping related function. Accordingly, it is important that the RTC 108 operate continuously to maintain accurate time. It may be desirable or necessary for the RTC to operate in situations where other portions of the processor may be turned off in an effort to save power, or for any other reason. For instance, the RTC may be able to "wake-up" other portions of the circuit that have been powered off in an effort to conserve power. Since an external power supply will almost always be connected to the processor circuit, it can be used to power the portions of the RTC which need to run continuously, even when other portions of the processor are powered off.

Figure 2:
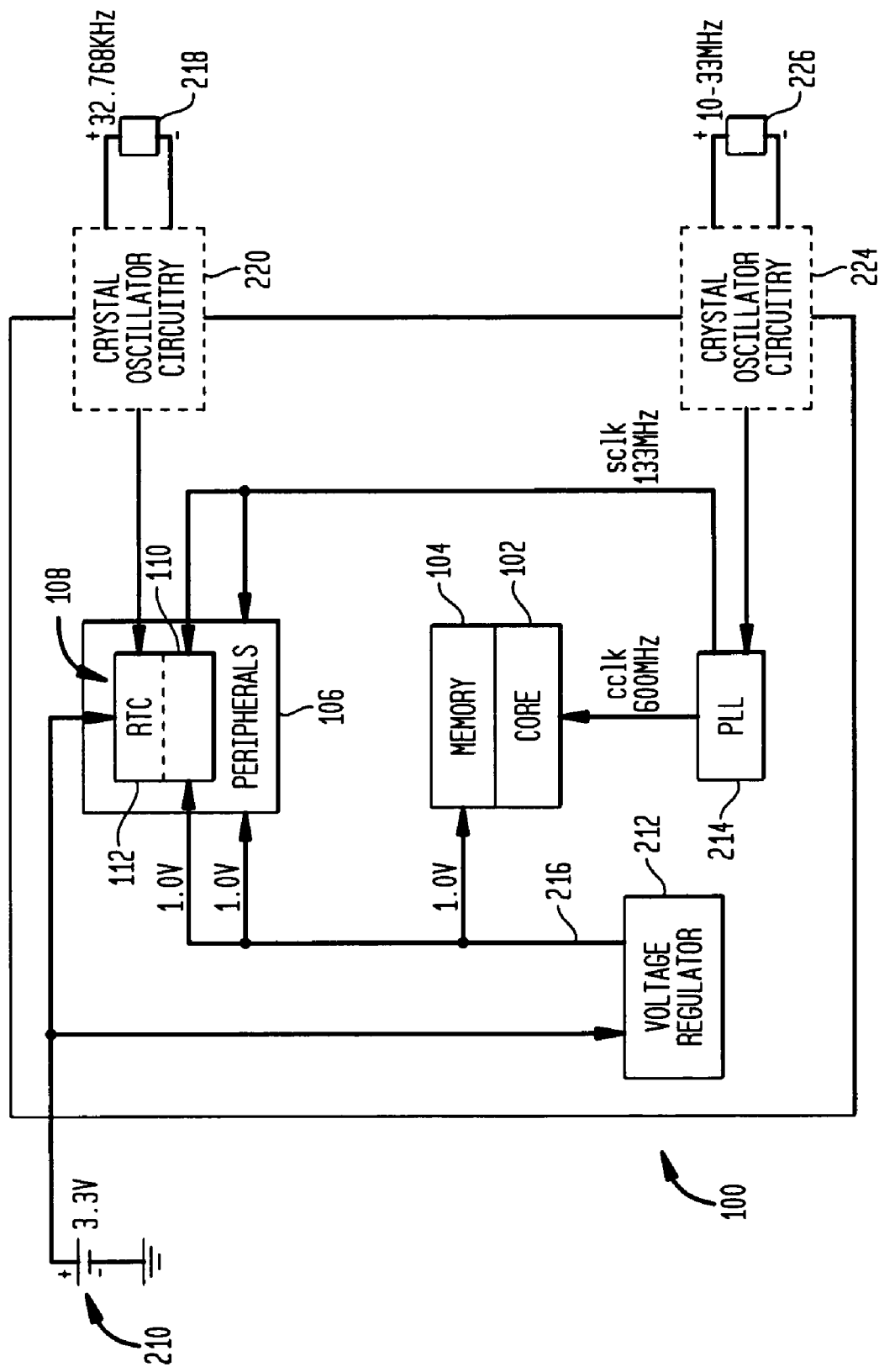
FIG. 2 is a more detailed block diagram of the processor of FIG. 1.

FIG. 2 is a more detailed block diagram of the processor to which the present invention may apply. The processor 100 comprises the core 102, the memory 104, peripherals 106, a voltage regulator 212, and a phase-locked loop (PLL) 214. The processor 100 receives a 3.3 V input 210 from an external source. The voltage regulator 212, which may be a standard voltage regulator, receives the 3.3 V signal 210 from the external source and outputs a 1.0 V signal 216 that powers the 1.0 V logic portions of the processor. One of the processor peripherals 106 may be the RTC peripheral 108, having a 3.3 V logic domain 112 and a 1.0 V logic domain 110. The 3.3 V logic domain receives 3.3 V signal 210, while the 1.0 V logic domain receives 1.0 V signal 216.

As shown in FIG. 2, the processor 100 includes a plurality of clocking domains, in addition to the voltage domains. A first crystal oscillator 218, having an oscillation frequency of 32.768 kHz, is provided externally to the processor. The crystal oscillator signal is input to crystal oscillator circuitry 220, which could be standard crystal oscillator circuitry for amplifying or otherwise manipulating the crystal oscillator signal. The crystal oscillator circuitry may comprise components internal and/or external to the processor. The output of crystal oscillator circuitry 220, also a 32.768 kHz signal in this non-limiting example, is input to the RTC 108. Other methods of producing this signal could be used. The output signal of crystal oscillator circuitry 220 is downsampled by the RTC peripheral 108 to obtain a 1 Hz oscillating signal corresponding to the RTC clock signal (not shown) for counting seconds. As would be known to one skilled in the art, the downsampling could be done in a variety of ways. For example, the downsampling could be done by a power of two, requiring the 32.768 kHz output of crystal oscillator circuitry 220 to be divided by two a total of fifteen times, since $2^{15}$=32,768. Alternatively, a ripple counter, shift counter, or any other divide-by-N counter could be used. Alternatively, the 1 Hz RTC clock signal could be generated by any other known means, for example, an external 1 Hz clock generator.

A second crystal oscillator 222 provides an oscillating signal with a frequency in the range of 10–33 MHz. The signal of the second crystal oscillator 222 is input to crystal oscillator circuitry 224, which may be similar to crystal oscillator circuitry 220. Similarly, the crystal oscillator circuitry 224 may comprise components internal and/or external to the processor 100. The output of crystal oscillator circuitry 224 is input to a programmable phase-locked loop 214.

The programmable PLL 214 can produce an output signal with a frequency that is equal to the frequency of the input signal, in this case the signal from the crystal oscillator circuitry 224, multiplied by an integer factor of 1–63. In this example, the PLL 214 is used to produce a 600 MHz core clock signal, cclk, and a 133 MHz system clock signal, sclk. The cclk speed represents the speed with which the core operates to fetch instructions or data, or to manipulate or process instructions or data. However, much of the processor may not need to operate at such a fast speed, or may not be capable of operating at such a fast speed. Thus, the 133 MHz signal sclk is provided. The sclk signal can be input to one or more peripherals 106, including the RTC 108. A fourth clock speed (not shown), equal to sclk divided by 32, or approximately 4 MHz, is present purely within the RTC peripheral 108, and will be described in greater detail with reference to FIG. 5. As mentioned, the clock frequency values described are non-limiting. Also, it should be appreciated that the present invention may apply in circuits without multiple clocking domains.

Figure 3:
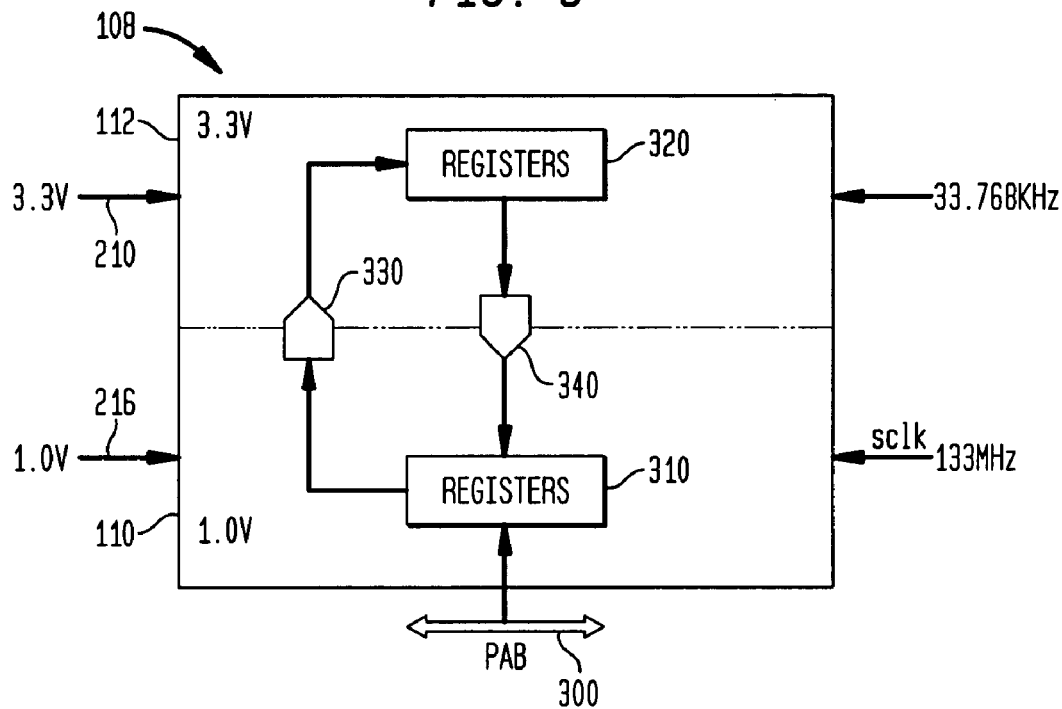
FIG. 3 is a more detailed block diagram of the Real Time Clock (RTC) peripheral of FIG. 2.

With reference to FIG. 3, the RTC peripheral 108 of FIG. 2 is shown with a 3.3 V logic domain 112 and a 1.0 V logic domain 110. The 3.3 V domain 112 receives 3.3 V signal 210 of FIG. 2. The 1.0 V domain 110 receives the 1.0 V signal 216 of FIG. 2. The 3.3 V domain 112 also receives the 32.768 kHz oscillating signal from crystal oscillator circuitry 220 of FIG. 2. The 1.0 V domain 110 receives the 133 MHz signal sclk from PLL 214 of FIG. 2. A peripheral access bus (PAB) 300 is used to enable communications between the RTC 108 and the rest of the processor. The PAB 300 is a 16 bit bus, but could be any size bus. The 1.0 V domain 110 comprises registers 310, which will be described in more detail with reference to FIG. 5. The 3.3 V domain 112 comprises registers 320. Level shifters 330 and 340 are provided to enable the transfer of signals across the voltage domain boundary, and are also described further in connection with FIG. 5.

One drawback of known level shifters is that they consume power. There are generally two types of power consumption related with level shifters; static leakage power consumption, and dynamic power consumption. Static leakage power consumption is the power that is lost when the level shifter is inactive, i.e., when it is not actively operating to transfer a signal from a first voltage value to a second voltage value. The amount of static leakage power consumption associated with a level shifter may depend on factors such as the structure of the level shifter. Dynamic power loss is the power that is lost during the active operation of the level shifter, in other words, when the level shifter is actively operating to transfer a signal from a first voltage value to a second voltage value. It is desirable to minimize the number of level shifters used, to limit static and dynamic power consumption.

In some circuits or systems in which the voltage difference between voltage domains is small enough, the same structure can be used as a low-to-high level shifter or a high-to-low level shifter. However, it is known that transferring a signal from a low voltage domain to a high voltage domain often requires different circuitry than does the transfer of a signal from a high voltage domain to a low voltage domain. An exemplary form of the level shifters 330 of the present application, enabling the low-to-high (1.0 V to 3.3 V) signal transfer, may be found in U.S. patent application Ser. No. not yet assigned, entitled "Pad Logic Level Translator" filed Feb. 25, 2004 by Brian Johansson and Stuart Patterson, incorporated herein by reference.

Figure 4:
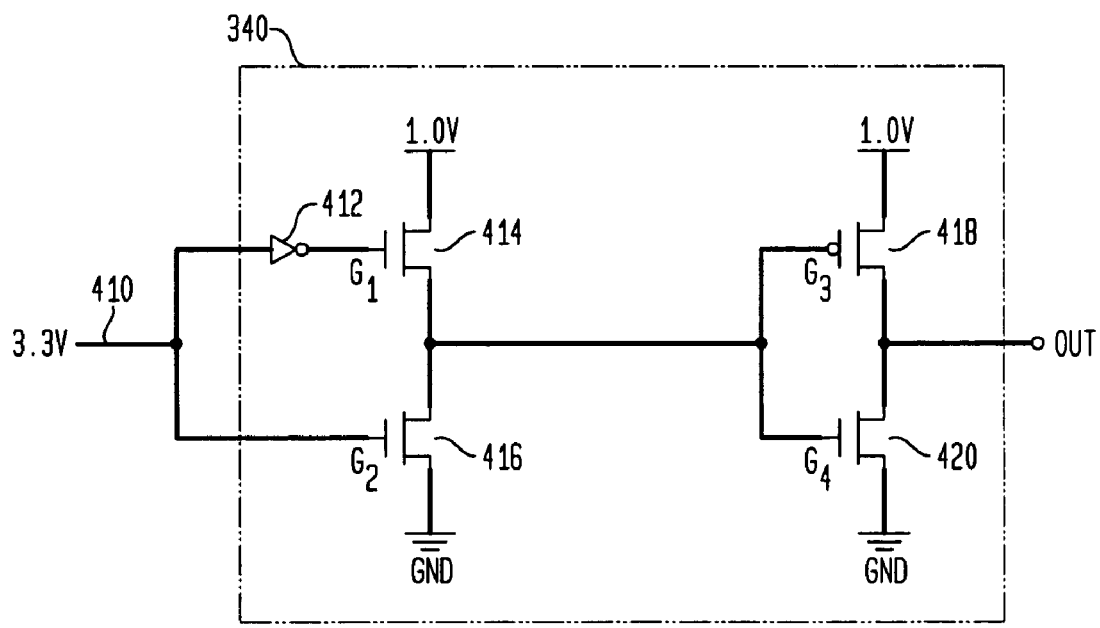
FIG. 4 illustrates a high-to-low level shifter that may be used in a circuit according to the present invention.

An example of a level shifter 340 enabling the high-to-low (3.3 V to 1.0 V) signal transfer is illustrated in FIG. 4. Assuming that the signal to be transferred is a high state 3.3 V signal 410, this signal is supplied to inverter 412, which includes a 3.3 V NMOS transistor coupled with a 3.3 V PMOS transistor (not shown). The output of inverter 412 is supplied to gate $G_1$ of 3.3 V NMOS transistor 414. Signal 410 is also supplied to gate $G_2$ of 3.3 V NMOS transistor 416, which has its source connected to ground GND. The drain of transistor 414 receives a 1.0 V input. The source of transistor 414 is connected to the drain of transistor 416. The source of transistor 414 is also input to gate $G_3$ of 1.0 V PMOS transistor 418, and to gate $G_4$ of 1.0 V NMOS transistor 420, which has its source connected to ground GND. The drain of PMOS transistor 418 receives a 1.0 V input. The source of PMOS transistor 418 is connected to the drain of transistor 420. The source of PMOS transistor 418 also provides the desired high state 1.0 V output OUT. Other types of level shifters than that illustrated could also be used, and the invention is not limited to any particular type of level shifter.

In the present non-limiting example, level shifters 340 generally consume less dynamic power than do level shifters 330. Furthermore, level shifters 330 occupy a greater amount of chip area than do level shifters 340. Thus, it is desired to minimize the number of level shifters 330 used.

Figure 5:
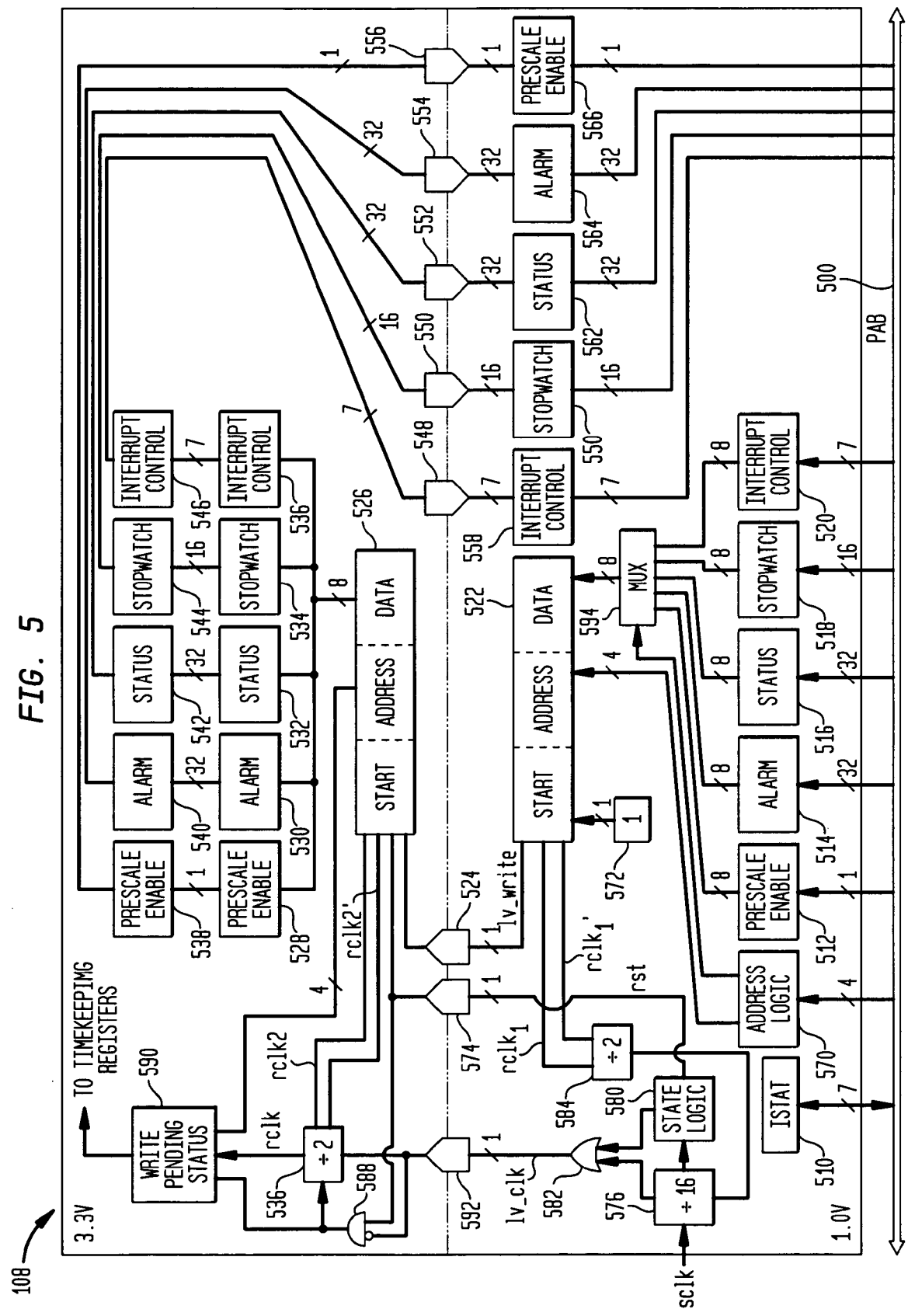
FIG. 5 is a more detailed view of the RTC peripheral of FIG. 3.

FIG. 5 illustrates a more detailed version of the RTC peripheral of FIG. 3. The RTC 108 performs several functions, as mentioned previously, which require separate registers. Accordingly, six groups of registers are provided by the RTC peripheral: interrupt status (ISTAT); prescale enable; alarm; status; stopwatch; and interrupt control. The invention is not limited to these registers, but rather may apply to circuits with any number of registers.

The interrupt status register 510 is only implemented in the 1.0 V logic domain, and thus does not require the transfer of signals across the voltage domain boundary. The interrupt status register 510 has seven implemented bits and one null bit written or read by the PAB 500, which operates at the speed of sclk of FIG. 3. The other five register groups all require signal transfer across the voltage domain boundary, and thus all include a PAB register and read shadow register implemented in the 1.0 V logic domain, and a hold register and timekeeping register in the 3.3 V logic domain. The PAB registers 512 (prescale enable), 514 (alarm), 516 (status), 518 (stopwatch), and 520 (interrupt control) are configured to be written to by the PAB 500, which operates at the speed of the system clock sclk. The PAB 500 is a 16 bit bus, but any bus size could be used. The prescale enable register 512 has 1 implemented bit, and 7 null bits. The alarm and status registers, 514 and 516, each have 32 implemented bits, and thus are written to by the PAB 500 in two clock cycles. The stopwatch register 518 has 16 implemented bits, and the interrupt control register 520 has seven implemented bits and one null bit. Thus, the total number of implemented bits from the five PAB registers that require transfer across the voltage domain boundary is eighty-eight. It should be appreciated that the invention is not limited to any specific number of bits.

The PAB register 512, 514, 516, 518, and 520 are connected via respective 8-bit busses to multiplexer (MUX) 594. A shift register 522 is also included in the 1.0 V logic domain of the RTC 108. Address logic circuitry 570 is also provided, and receives bits from the PAB 500 which indicate the address of the holding registers in the 3.3 V domain to which bits in the PAB registers are destined. An output of address logic circuitry 570 is input to MUX 594 so that MUX 594 will select the appropriate input from the PAB registers, and output an 8-bit signal via an 8-bit bus to shift register 522. Another output of the address logic circuitry 570 is connected via a 4-bit bus to shift register 522. Shift register 522 also receives a start signal 572. Thus, the shift register 522 is thirteen bits long, with an eight bit data payload, four address bits, and one start bit. The invention is not limited to a shift register of any particular length. The indicated division of shift register 522 into three sections, as illustrated in FIG. 5, does not necessarily represent a physical division. Shift register 522 is clocked by non-overlapping clock signals $rclk_1$ and $rclk_1'$, output from divide-by-2 counter 584, and described in more detail below.

An output of shift register 522, lv_write, is connected to level shifter 524. The output of level shifter 524 is input to a shift register 526, which stores an eight bit data payload, four address bits, and one start bit in the 3.3 V logic domain. As with shift register 522, the indicated separation of shift register 526 into three sections does not necessarily represent a physical separation. The shift register 526 is connected via respective 8-bit busses to holding registers 528, 530, 532, 534, and 536. The holding registers are connected via a respective bus of the width indicated in FIG. 5 to the timekeeping registers 538, 540, 542, 544, and 546. The timekeeping registers are connected via a respective bus of the indicated width to respective high-to-low level shifters 548, 550, 552, 554, and 556, which in turn are connected to respective read shadow registers 558, 560, 562, 564, and 566 in the 1.0 V logic domain. Note that one level shifter is provided for each implemented bit that is transferred across the voltage domain boundary from the 3.3 V domain to the 1.0 V domain. Thus, 548 represents seven level shifters in parallel, one level shifter for each of the seven implemented bits of the interrupt control register. Similarly, 550 represents 16 level shifters in parallel, 552 represents 32 level shifters in parallel, 554 represents 32 level shifters in parallel, and 556 represents one level shifter. There are thus a total of eighty-eight level shifters operating in parallel to read from the five timekeeping registers 538–546. The read shadow registers are connected to PAB 500 via respective busses of the indicated width.

A divide-by-16 counter 576 is provided to produce a downsampled version of signal sclk. One output of divide-by-16 counter 576 is input to divide-by-2 counter 584. Divide-by-2 counter 584 outputs two non-overlapping clock signals, $rclk_1$ and $rclk_1'$. The signals are 180° out-of-phase with each other, such that the two signals do not attain a high logic state at the same time. To ensure this non-overlapping relationship, it may be desirable to form each signal, $rclk_1$ and $rclk_1'$, with a low duty cycle that is greater than 50%.

A second output of divide-by-16 counter 576 is input to state logic circuitry 580. As described more fully in what follows, state logic circuitry 580 monitors the state of the signal transfer protocol. An OR gate 582 is provided in the 1.0 V logic domain, and receives as inputs an output from divide-by-16 counter 576, and an output of state logic circuitry 580. The output of OR gate 582, lv_clk, is input to level shifter 592, an output of which is input to a divide-by-2 counter 586. Divide-by-2 counter 586 outputs two non-overlapping clock signals, $rclk_2$ and $rclk_2'$. The signals are 180° out-of-phase with each other, such that the two signals do not attain a high logic state at the same time. To ensure this non-overlapping relationship, it may be desirable to form each signal, $rclk_2$ and $rclk_2'$, with a low duty cycle that is greater than 50%.

Another output of level shifter 592 is inverted and input to AND gate 588. The output of level shifter 574 is a second input of AND gate 588. The output of AND gate 588 is input to a write pending status register 590, which also receives address bits from shift register 526, and $rclk_2$ of divide-by-2 counter 586. The write pending status register 590 monitors the state of each of the four holding registers: alarm 530, status 532, stopwatch 534, and interrupt control 536. An output from write pending status register 590 is input to each of the four corresponding timekeeping registers 540, 542, 544 and 546. The output of AND gate 588 is also input to divide-by-2 counter 586 as a reset signal.

A description of the operation of RTC 108 will now be given, and can generally be thought of as comprising read and write operations. Any write operation from the PAB to the PAB registers is performed on demand only. A write operation requires transferring bits from the PAB 500 to the desired timekeeping registers. To do this, the bits are written to the desired PAB register via a bus of the width indicated in the FIG. 5. The bits in the PAB registers are then "unpacked" to shift register 522 via MUX 594. The term "unpacking," as used herein refers to dividing a data stream into pieces and transferring the pieces serially. Shift register 522 also receives a start bit 572, which in this non-limiting example is hard-wired to a high logic state of 1. Furthermore, the address bits transferred from PAB 500 to address logic 570 are sent to shift register 522 via a 4-bit bus. As mentioned, the address bits indicate the destination holding register in the 3.3 V logic domain for the bits in the respective PAB register.

The bits in the shift register 522 are transferred serially across the voltage domain boundary by level shifter 524, to shift register 526. This is accomplished using a 3-wire serial protocol, described in greater detail below. Once the appropriate bits, as described below, are present in the shift register 526, the data bits are presented in parallel via an 8-bit bus to the holding registers. However, only the holding register indicated by the address bits in shift register 526 will latch the data bits. Specifically, the bits are "packed" from the shift register to the holding registers. As used herein, "packed" refers to combining pieces of a data stream (i.e., from shift register 526) and transferring the combined data stream (i.e., from a holding register) at one time. Thus, a write operation requires a parallel write of bits from the PAB to a PAB register, unpacking the bits from the PAB register to shift register 522 via MUX 594, transfer of the bits from shift register 522 to level shifter 524 via parallel to serial conversion, transfer of the bits from level shifter 524 to shift register 526 via serial to parallel conversion, and packing of the bits from shift register 526 to the holding register.

Read operations are prefetched at every clock cycle of the 1 Hz RTC clock. The bits are read in parallel from the timekeeping registers 538, 540, 542, 544, and 546 in the 3.3 V logic domain via respective level shifters 548, 550, 552, 554, and 556, to respective read shadow registers 558, 560, 562, 564, and 566. Note that one level shifter is provided for each implemented bit that is transferred across the voltage domain boundary from the 3.3 V domain to the 1.0 V domain. Thus, 548 represents seven level shifters in parallel, one level shifter for each of the seven implemented bits of the interrupt control register. Similarly, 550 represents 16 level shifters in parallel, 552 represents 32 level shifters in parallel, 554 represents 32 level shifters in parallel, and 556 represents one level shifter. There are thus a total of eighty-eight level shifters operating in parallel to read from the five timekeeping registers 538–546. The read shadow registers can be updated by an update tick provided by control circuitry (not shown) that synchronizes with the 1 Hz RTC clock signal.

As mentioned, a 3-wire serial protocol enables the transfer of bits from shift register 522 in the 1.0 V domain to shift register 526 in the 3.3 V domain. The three signals (wires) used are lv_write, rst, and lv_clk. As mentioned previously, lv_write represents an output of shift register 522. The signal rst represents an output of state logic circuitry 580. The signal lv_clk is now described.

To generate lv_clk, sclk is input to divide-by-16 counter 576, which may be a standard, fixed divide-by-N counter. The reason for downsampling sclk is that the low-to-high level shifters responsible for transferring a signal from the low voltage domain to the high voltage domain have a maximum frequency response, above which they may not accurately transfer a signal. Thus, level shifter 592 may not be able to accurately transfer signal sclk across the voltage domain boundary. The clock signal output from divide-by-16 counter 576, of approximately 8 MHz, is below the frequency limit of the low-to-high level shifters. One output of divide-by-16 counter 576 is input to OR gate 582. A second output of divide-by-16 counter 576 is input to state logic circuitry 580, which operates to monitor the state of the shift register 526 by means of monitoring the output of divide-by-16 counter 576. An output of state logic circuitry 580 is used as a second input to OR gate 582. The output of OR gate 582 is clock signal lv_clk. For reasons described below, the OR gate 582 is used to maintain clock signal lv_clk in a high state in response to certain conditions of the shift register 526 being met.

The relationship of the signals of the 3-wire protocol is illustrated in FIG. 6. There are four combinations of lv_clk and rst to consider. The first combination corresponds to a latent period of the RTC 108. Specifically, when the signal rst is low, and the signal lv_clk is low, no operation is performed by the level shifter 524 or by the shift registers 522 and 526.

A second combination corresponds to active transfer of signals. Specifically, when the signal rst is low, and the signal lv_clk is high, bits are transferred from shift register 522 to shift register 526 via level shifter 524. Shift register 522 is clocked by non-overlapping clock signals $rclk_1$ and $rclk_1'$. Shift register 526 is clocked by non-overlapping clock signals $rclk_2$ and $rclk_2'$. Specifically, an output of divide-by-16 counter 576 is input to divide-by-2 counter 584, which may be a standard divide-by-2 counter. The outputs of divide-by-2 counter 584, $rclk_1$ and $rclk_1'$, are used to clock the shift register 522. The output of level shifter 592 is input to divide-by-2 counter 586, the outputs of which, $rclk_2$ and $rclk_2'$, are used to clock shift register 526 in the 3.3 V domain.

The third and fourth possible combinations of lv_clk and rst correspond to different reset states of the RTC 108. The third combination occurs when the signal rst is high, and lv_clk is low, causing the shift register 526, divide-by-2 counter 586, and the write pending status register 590 to be reset. Specifically, the high rst leads to a high output from level shifter 574, which acts to reset the shift register 526. The high rst and low lv_clk produce a high output of AND gate 588, which acts to reset write pending status register 590. The high output of AND gate 588 also resets divide-by-2 counter 586. It is desired to perform such a reset only when starting the RTC, or in other rare instances.

The fourth possible combination of lv_clk and rst corresponds to when the rst signal and lv_clk signal are both high, causing only the shift register 526 to reset. Specifically, the high rst signal leads to a high output of level shifter 574, which acts to reset shift register 526. At this time, the bits in the shift register 526 are all set to zero. But the combination of the high rst signal and high lv_clk signal produces a low output of AND gate 588, so that write pending status register 590 and divide-by-2 counter 586 are not reset. It is necessary to clear the shift register in this manner after each data byte has been read to prevent erroneous copying from the shift register to the holding registers prior to a complete new data byte being input to shift register 526. It is not desired, however, to reset the write pending status register or the divide-by-2 counter 586 at this time. Thus, the two distinct reset combinations enable the proper and efficient operation of the 3-wire serial protocol.

FIG. 7 shows the state of the shift register 526 after each cycle of the signal $rclk_2'$ output from divide-by-2 counter 586, according to the 3-wire serial protocol of FIG. 6. The bits to be transferred across the voltage domain boundary comprise a start bit, address bits A3–A0, and data bits D7–D0. These bits are all transferred via the level shifter 524 of FIG. 5, with one bit being transferred during a clock cycle of $rclk_2'$. State 1 corresponds to a high rst and low lv_clk state, so that the shift register 526, write pending status register 590, and divide-by-2 counter 586 are all reset. A start bit is the first bit to be transferred, as shown in state 2. The address bits A3–A0 are transferred following the start bit, as shown in states 3–6. The data bits D7–D0 are transferred following the address bits, as shown in states 7–14. When the start bit has shifted into the appropriate position of the shift register 526, as shown in state 14, the four bit address is decoded using decoder logic (not shown in FIG. 5) to determine the destination holding register or registers in the 3.3 V domain, and the data byte is copied to the indicated holding register or registers. In state 15, the shift register 526 is reset to return the state of the bits in the shift register to zero. It should be noted, that the state logic circuitry 580 of FIG. 5 has been monitoring the state of shift register 526, so that when shift register 526 reaches state 14, the state logic circuitry 580 produces an output that maintains signal lv_clk in a high state for an extended duration. This is done to ensure that signal lv_clk does not return to a low state while rst is high, which would return the RTC to state 0 of FIG. 7, i.e., the write pending status register 590 and divide-by-2 counter 586 would reset in addition to shift register 526.

As stated, the timekeeping registers 538–546 are refreshed every second, according to the 1 Hz RTC clock signal, and thus, the shift register clocking signals, $rclk_1$, $rclk_1'$, $rclk_2$, and $rclk_2'$, are sufficiently fast to enable writing from PAB 500 to all holding registers 528–536 during each clock cycle of the RTC clock signal. It should be appreciated that the 3-wire protocol described herein may be applied to any number of start, address, or reset bits. The invention is not limited to any specific number of bits. It should also be noted with respect to FIG. 7 that state 1 is performed initially, and then states 2–15 are repeated. By using the described 3-wire protocol, including serial transfer of bits, the number of level shifters necessary to transfer signals from the 1.0 V domain to the 3.3 V domain is significantly reduced compared to a system that transfers the signals in parallel.

Figure 8:
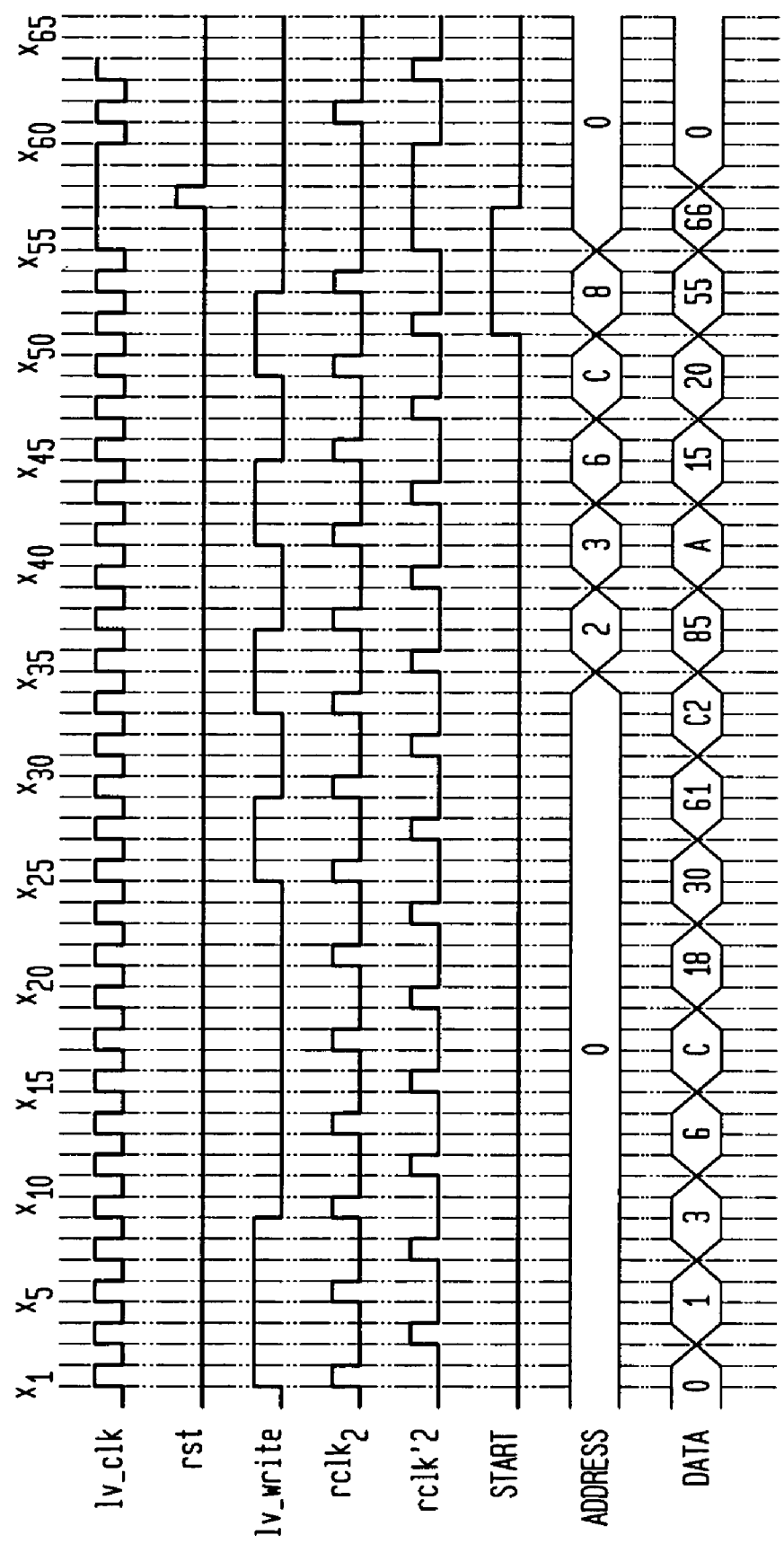
FIG. 8 illustrates a timing diagram corresponding to the 3-wire serial protocol of FIGS. 6 and 7.

FIG. 8 illustrates an example of the operation of the 3-wire serial protocol according to the present invention during the course of transferring one data byte from the 1.0 V logic domain to the 3.3 V logic domain, as discussed in connection with FIG. 7. The illustrated time increments correspond to one half period of the signal lv_clk in the 1.0 V domain. The illustrated signals, lv_clk, rst, and lv_write correspond to signals in the 1.0 V domain upon being input to the corresponding level shifters 592, 574, and 524. Signals $rclk_2$ and $rclk_2'$ represent the non-overlapping clock signals output from divide-by-2 counter 586 of FIG. 5. Signal start indicates the state of the start bit in shift register 526. Signals address and data represent the state of the address and data bits in hexadecimal notation, respectively, in the shift register 526.

Between times $x_1$ and $X_{57}$ rst is in a low state. During this time, signal lv_clk oscillates between a low state and a high state. Thus, as discussed in connection with FIG. 6, when lv_clock is in a high logic state and rst is in a low logic state, bits are transferred from shift register 522 in the 1.0 V domain to shift register 526 in the 3.3 V domain. The bits are input to shift register 526 at a rising edge of $rclk_2'$. Prior to $x_1$, it is assumed that the shift register 526 is in state 15 of FIG. 7, and thus the start, address, and data signals in shift register 526 are zero. As bits are input to shift register 526, the address and data bits are updated, as shown. At time $X_{51}$, the start bit has reached the end of shift register 526, as indicated by the rising edge of signal start in FIG. 8. This corresponds to state 14 of FIG. 7. The data bits are written from the shift register 526 to the appropriate holding register when $rclk_2$ and start are both high, at time $X_{53}$. The shift register is then reset at time $X_{57}$ by a single pulse of signal rst, output from the state logic circuitry 580 of FIG. 5. This corresponds to state 15 of FIG. 7. Note that the state logic circuitry 580 also operates to maintain signal lv_clk high for an extended period from $X_{55}$ to $x_{60}$, in order to prevent an accidental occurrence of a high logic state of rst and a low logic state of lv_clk, which would give rise to a reset of shift 526, divide-by-2 counter 586, and write pending status register 590.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A processor comprising:
   a first voltage domain;
   a second voltage domain;
   a first level shifter configured to transfer a reset signal from the first voltage domain to the second voltage domain;
   a second level shifter configured to transfer a clock signal from the first voltage domain to the second voltage domain; and
   a third level shifter configured to transfer a data signal from the first voltage domain to the second voltage domain, wherein the data signal comprises a start bit, an address bit, and a data bit.

2. The processor of claim 1, wherein a voltage of the first voltage domain is lower than a voltage of the second voltage domain.

3. The processor of claim 1, wherein the data signal comprises one start bit, four address bits, and eight data bits.

4. The processor of claim 1, further comprising a first shift register in the first voltage domain having an output configured to output bits of the data signal to the third level shifter.

5. The processor of claim 4, wherein the first shift register is configured to store 13 bits.

6. The processor of claim 4, further comprising a first register having an input and an output, the output configured to provide bits to the first shift register.

7. The processor of claim 6, further comprising a peripheral access bus configured to input bits to the first register.

8. The processor of claim 1, further comprising a second shift register in the second voltage domain having an input configured to receive bits of the data signal from the third level shifter.

9. The processor of claim 8, wherein the second shift register is configured to store 13 bits.

10. The processor of claim 8, further comprising a second register having an input configured to receive bits from the second shift register.

11. The processor of claim 10, further comprising a third register having an input configured to receive bits from the second register.

12. The processor of claim 11, further comprising a fourth level shifter configured to transfer bits from the third register to the first voltage domain.

13. The processor of claim 12, further comprising a fourth register in the first voltage domain having an input configured to receive bits from the fourth level shifter, and an output configured to output the bits to the peripheral access bus.

14. A method of transferring signals from a first voltage domain of a processor to a second voltage domain of a processor, the method comprising acts of:
   using a first level shifter to transfer a reset signal from the first voltage domain to the second voltage domain;
   using a second level shifter to transfer a clock signal from the first voltage domain to the second voltage domain; and
   using a third level shifter to transfer a data signal from the first voltage domain to the second voltage domain;
   wherein data is transferred from the first voltage domain to the second voltage domain in response to the reset signal being in a low state and the clock signal being in a high state.

15. The method of claim 14, wherein a voltage of the first voltage domain is lower than a voltage of the second voltage domain.

16. The method of claim 14, wherein a shift register, a write pending status register, and a clock divider are reset in response to the clock signal being in a low state and the reset signal being in a high state.

17. The method of claim 14, wherein a shift register is reset in response to the clock signal being in a high state and the reset signal being in a high state.

* * * * *